US012677682B2

(12) United States Patent (10) Patent No.: US 12,677,682 B2
Ecton et al. (45) Date of Patent: Jul. 7, 2026

(54) INTEGRATED CIRCUIT PACKAGE WITH MULTI-LAYERED METALLIZATION LINES INCLUDING A COPPER LAYER ON A NON-COPPER SEED LAYER

(71) Applicant: Intel Corporation, Santa Clara, CA (US)

(72) Inventors: Jeremy Ecton, Gilbert, AZ (US); Aleksandar Aleksov, Chandler, AZ (US); Kristof Darmawikarta, Chandler, AZ (US); Robert A. May, Chandler, AZ (US); Brandon Marin, Gilbert, AZ (US); Benjamin Duong, Phoenix, AZ (US); Suddhasattwa Nad, Chandler, AZ (US); Hsin-Wei Wang, Chandler, AZ (US); Leonel Arana, Phoenix, AZ (US); Darko Grujicic, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 17/856,663

(22) Filed: Jul. 1, 2022

(65) Prior Publication Data

US 2024/0006327 A1    Jan. 4, 2024

(51) Int. Cl.
*H10W 70/60*          (2026.01)
*H10W 70/05*          (2026.01)
(Continued)

(52) U.S. Cl.
CPC ........... *H10W 70/65* (2026.01); *H10W 70/05* (2026.01); *H10W 70/095* (2026.01); *H10W 70/611* (2026.01); *H10W 70/66* (2026.01);

*H10W 70/685* (2026.01); *H10W 90/00* (2026.01); *H10W 90/401* (2026.01); *H10W 90/701* (2026.01); *H10W 90/794* (2026.01)

(58) Field of Classification Search
CPC ............ H01L 23/5386; H01L 21/4857; H01L 21/486; H01L 23/49822; H01L 23/49838; H01L 23/49866; H01L 25/0655; H01L 23/49816; H01L 23/49833; H01L 23/5385; H01L 24/08; H01L 2224/08235; H01L 23/5383
See application file for complete search history.

(56) References Cited

U.S. PATENT DOCUMENTS

2020/0205279 A1*  6/2020  Ecton ................ H01L 23/49816
2020/0258827 A1*  8/2020  Aleksov ............... H01L 21/486
2021/0066232 A1*  3/2021  May ....................... H01L 24/24

* cited by examiner

*Primary Examiner* — Ratisha Mehta
*Assistant Examiner* — Sophia W Kao
(74) *Attorney, Agent, or Firm* — Essential Patents Group, LLP

(57) ABSTRACT

IC die package routing structures including a bulk layer of a first metal composition on an underlying layer of a second metal composition. The lower layer may be sputter deposited to a thickness sufficient to support plating of the bulk layer upon a first portion of the lower layer. Following the plating process, a second portion of the lower layer may be removed selectively to the bulk layer. Multiple IC die may be attached to the package with the package routing structures responsible for the transmission of high-speed data signals between the multiple IC die. The package may be further assembled to a host component that conveys power to the IC die package.

19 Claims, 11 Drawing Sheets

(51) Int. Cl.
    *H10W 70/65*           (2026.01)
    *H10W 70/66*           (2026.01)
    *H10W 70/685*        (2026.01)
    *H10W 90/00*           (2026.01)

100

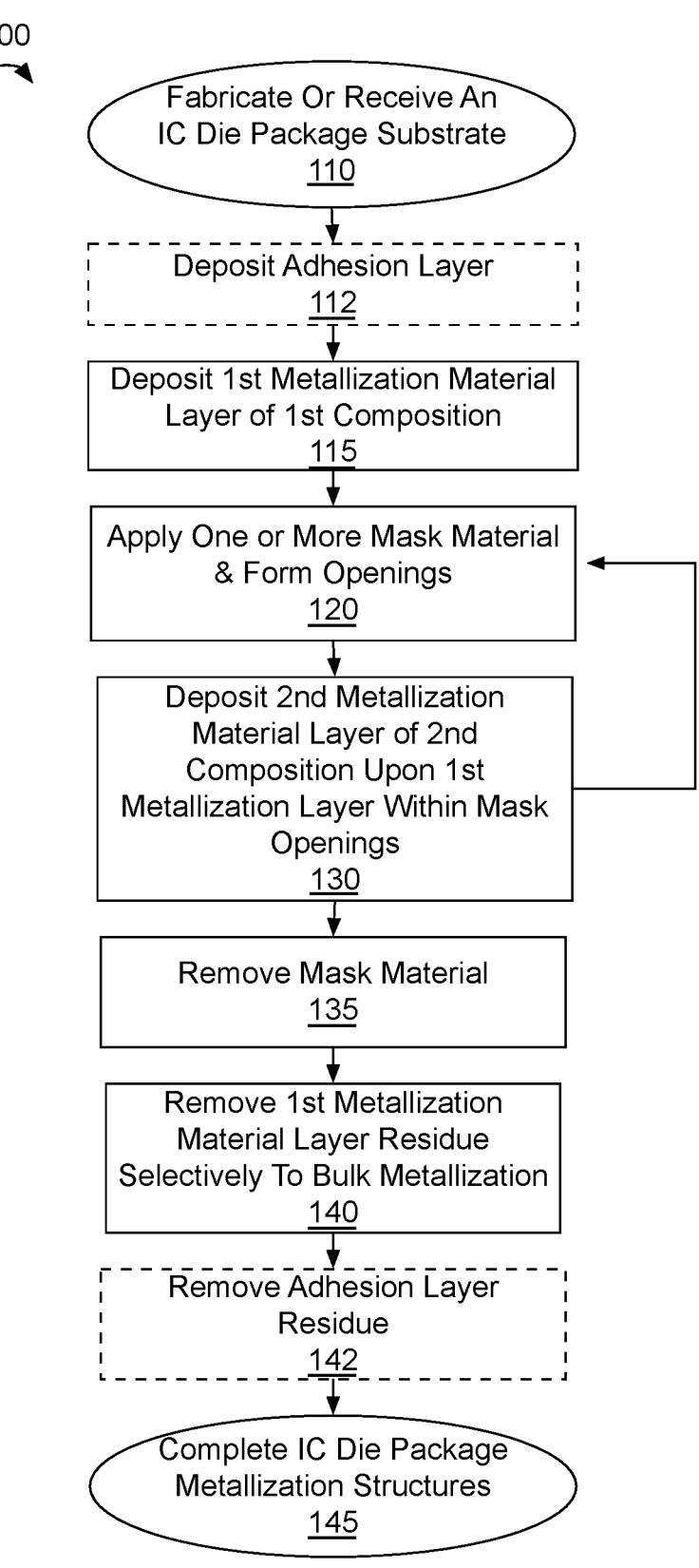

Fabricate Or Receive An
IC Die Package Substrate
110

Deposit Adhesion Layer
112

Deposit 1st Metallization Material
Layer of 1st Composition
115

Apply One or More Mask Material
& Form Openings
120

Deposit 2nd Metallization
Material Layer of 2nd
Composition Upon 1st
Metallization Layer Within Mask
Openings
130

Remove Mask Material
135

Remove 1st Metallization
Material Layer Residue
Selectively To Bulk Metallization
140

Remove Adhesion Layer
Residue
142

Complete IC Die Package
Metallization Structures
145

FIG. 1

INTEGRATED CIRCUIT PACKAGE WITH MULTI-LAYERED METALLIZATION LINES INCLUDING A COPPER LAYER ON A NON-COPPER SEED LAYER

BACKGROUND

In electronics manufacturing, integrated circuit (IC) packaging is a stage of manufacture where an IC that has been fabricated on a die or chip comprising a semiconducting material is coupled to a supporting case or "package" that can protect the IC from physical damage and support electrical contacts suitable for further connecting to a host component, such as a printed circuit board (PCB). In the IC industry, the process of fabricating a package is often referred to as packaging, or assembly.

Next generation multi-chip packaging (MCP) demands greater interconnect density to support evolving systems-in-package and/or bandwidth-intensive applications. In a high bandwidth architecture, for example, multiple IC dies assembled on the package in close proximity may need to be electrically interconnected through fine routing layers that include lines (i.e., traces) embedded within an interconnect level of the packaging at a line density of at least 250 trace/mm. For package substrates comprising organic insulator materials that are typically fabricated through semi-additive techniques, the greater interconnect density needed for MCP will likely necessitate new approaches and/or architectures to replace conventions that have proven limited to lower line metallization densities and/or data transmission frequencies.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure. Further, where considered appropriate, reference labels have been repeated among the figures to indicate corresponding or analogous elements. In the figures:

FIG. 1 is a flow diagram illustrating methods of fabricating IC device package routing with metallization features comprising multiple material layers, in accordance with some embodiments;

DETAILED DESCRIPTION

Figure 2:
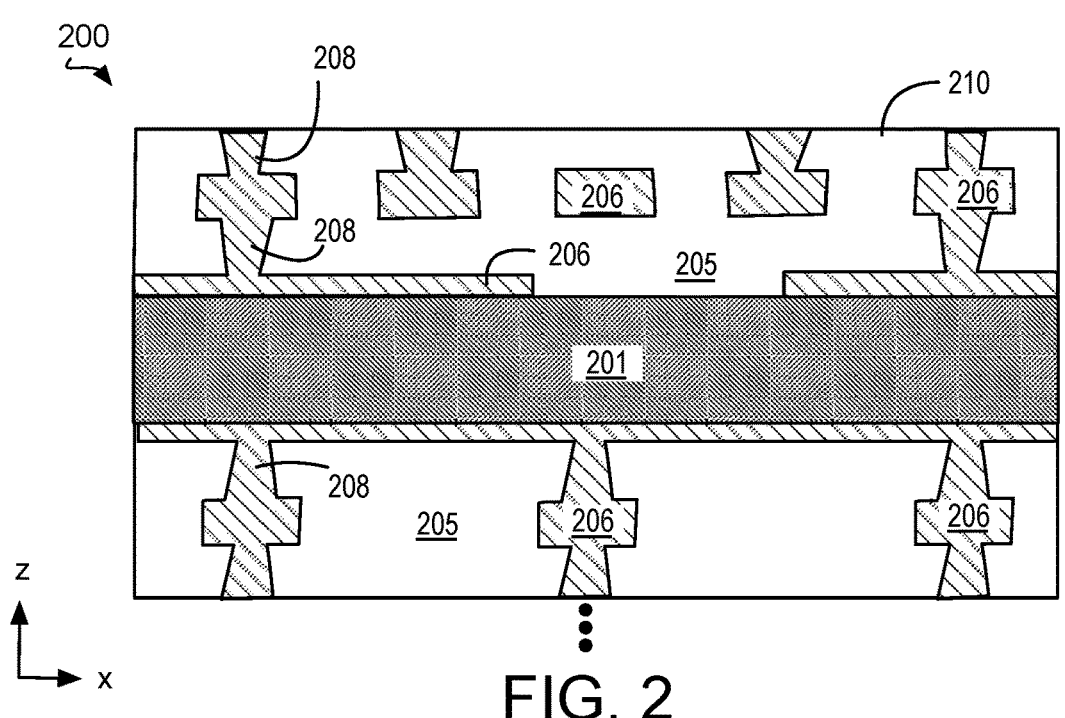
FIGS. 2, 3, 4, 5, 6, 7, 8, 9, 10, 11, 12, 13, 14 and 15 illustrate cross-sectional views through an IC device package as selected operations of an IC device package fabrication process is performed, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

FIG. 1 is a flow diagram illustrating methods 100 for fabricating IC device package routing with metallization features comprising multiple material layers, in accordance with some embodiments. Methods 100 are generally semi-additive processing (SAP) techniques that may be practiced to fabricate IC packages with an electrical routing structure that includes metallization features comprising multiple material layers. According to some embodiments, these multi-layered metallization features may comprise lines or traces that interconnect two IC die assembled to the package and may be electrically insulated with one or more organic dielectric build-up materials. With the multi-layered structure, line metallization fabricated according to methods 100 may achieve higher line densities and/or transmit high-frequency data signals with greater integrity. Accordingly, the high-density package metallization methods 100 may be advantageous for 2D, 2.5D, and 3D MCP packages. As described further below, in some implementations of methods 100, misalignment between multi-layered line metallization and overlying via metallization may be reduced to further enhance package interconnect input/output (I/O) density.

Generally, the multi-layered line metallization structures fabricated according to methods 100 may advance seed etch removal processes so that package line metallization suffers less dimensional loss. The multi-layered line metallization structures fabricated according to methods 100 may also advance seed etch removal processes so that surface roughening of line metallization is reduced. Signals conveyed through the multi-layered line metallization fabricated according to methods 100 may therefore experience reduced insertion loss and consequently provide greater signal integrity.

Methods 100 may be repeated any number of times to build up an interconnect structure comprising any number of levels of metallization features comprising multiple material layers. FIG. 2-7 illustrate cross-sectional views through an IC device package as selected operations of a first iteration of methods 100 is performed, in accordance with some embodiments. FIG. 8-15 further illustrate cross-sectional views through an IC device package as selected operations of a second iteration of methods 100 is performed in accordance with some alternate embodiments. In FIG. 2-15 exemplary metallization structures are illustrated on a "die-side" of the IC device package. However, two opposing sides of an IC device package may be concurrently built-up in a similar manner.

Referring first to FIG. 1, methods 100 begin at input 110 where a workpiece including a package substrate suitable for SAP is either fabricated or received as a preform. The package substrate fabricated or received at input 110 may have any architecture as embodiments are not limited in this context. Generally, the package substrate includes at least some electrically insulative material (i.e., insulator) and may further include one or more metallization features embedded within the insulator. In some embodiments, the workpiece fabricated or received is substantially planar and dimensioned in thickness and lateral area so as to be suitable support for panelized processing of multiple packages arrayed over the substrate (i.e., WLP). As further described below, the substrate may comprise one or more material layers. The various material layers of a substrate may be retained within a final singulated package, or separated from a final package as part of a sacrificial carrier.

The package substrate fabricated or received at input 110 may be "cored" or "coreless." In the absence of a core, a package substrate may rely on a sacrificial carrier to mechanically support the package build-up materials. In the example further illustrated in FIG. 2, package substrate 200 comprises a core 201. Core 201 may be any preform comprising any material with mechanical rigidity and/or stiffness sufficient to serve as a platform for building up layers of package metallization comprising line metallization 206 and via metallization 208 between two levels of line metallization 206. Such a build-up may be performed concurrently on a front (die) side and a back (land) side of the core 201.

As further illustrated in FIG. 2, package metallization is embedded within one or more layers of package insulator 205. In exemplary embodiments, package insulator 205 comprises an organic dielectric material (e.g., comprising a polymer). Package insulator 205 may comprise an epoxy resin, phenolic-glass, or a resinous film such as the GX-series films commercially available from Ajinomoto Fine-Techno Co., Inc. Exemplary epoxy resins include an acrylate of novolac such as epoxy phenol novolacs (EPN), or epoxy cresol novolacs (ECN). In some specific examples, package insulator 205 is a bisphenol-A epoxy resin, for example including epichlorohydrin. In other examples, package insulator 205 includes bisphenol-F epoxy resin (with epichlorohydrin). In other examples, package insulator 205 includes aliphatic epoxy resin, which may be monofunctional (e.g. dodecanol glycidyl ether), difunctional (butanediol diglycidyl ether), or have higher functionality (e.g. trimethylolpropane triglycidyl ether). In still other examples, package insulator 205 includes glycidylamine epoxy resin, such as triglycidyl-p-aminophenol (functionality 3) and N,N,N',N'-tetraglycidyl-bis-(4-aminophenyl)-methane (functionality 4). Although such polymeric materials may decompose at high processing temperatures (e.g., >400° C.), these materials may offer many advantages associated with SAP techniques.

Line and via metallization 206, 208 may have been formed with an additive or semi-additive process, for example. In some embodiments, line and via metallization 206, 208 comprise one or more layers of predominantly copper. In some examples, line metallization 206 comprises predominantly Cu and if there are any discernable layers, two or more of such layers are each predominantly Cu. For example, line metallization 206 may include a first layer of Cu that may have been deposited with a first deposition process (e.g., electroless plating), and a second layer of Cu that may have been deposited with a second deposition process (e.g., electrolytic plating) that relied on the first layer of Cu functioning as a seed layer. Since such material layers are both predominantly Cu, separate layers are not illustrated in FIG. 2. However, differences in the deposition process may result in the two layers having a different microstructure and/or impurity concentration. In accordance with SAP processing techniques, a blanket seed layer is patterned after depositing all line metallization. Since both the seed layer and bulk overlayer are predominantly Cu, line metallization 206 may experience significant lateral dimensional loss (e.g., >2 μm) during the seed layer patterning. Significant roughness (e.g., Ra>>100 nm) in line metallization 206 may also develop during seed layer patterning or during other subsequent processing. However, for exemplary embodiments where line metallization 206 has large lateral dimensions and/or will not convey high frequency data signals (e.g., power routing, etc.), such effects of the seed etch need not be detrimental to IC device package performance.

Returning to FIG. 1, methods 100 continue with the fabrication of a package routing structure that includes one or more multi-layered metallization features embedded within one or more electrical insulators. In some embodiments, methods 100 continue at block 112 where an adhesion material layer is deposited over the package substrate received or fabricated at block 110. Block 112 is illustrated in dashed line to emphasize that deposition of an adhesion material layer is optional. The adhesion material may have any composition suitable for increasing adhesion between the underlying package material and overlying metallization material layers. As the underlying package material will typically include a metallization structure that is to be electrically coupled to the overlying multi-layered metallization features fabricated by methods 100, the adhesion material layer deposited at block 112 is advantageously an electrical conductor.

Methods 100 continue at block 115 where a first metallization material layer is deposited. The first metallization material layer is either deposited directly on a surface of the underlying package material(s) or upon a surface of an intervening adhesion material layer, if present. The first metallization material layer has a first composition that is advantageously predominantly a first metal, which is other than copper. The first metal may be substantially pure, or may be alloyed with one or more other metals and/or dopants.

The first metal metallization material layer may be deposited to any thickness that ensures the first metallization material layer has sufficient conductivity to function as a seed layer for the subsequent deposition of a second metallization material layer. Hence, where the first metallization material layer has lower electrical conductivity than Cu, the first metallization material layer may be deposited to a greater thickness than would be needed for a seed layer comprising predominantly Cu.

The first metallization material layer may be deposited by any technique known to be suitable for a chosen composition. In accordance with some embodiments where a package insulator comprises an organic dielectric material that can decompose at higher temperatures (e.g., >400° C.), a PVD process is practiced at block 115 to deposit the first metallization material layer at a sufficiently low temperature (e.g., <350° C.). In exemplary embodiments, the PVD process deposits the first metallization material layer that is continuous, in contrast to discontinuous film comprising many islands of material that have not coalesced into a continuous layer. Such continuity is advantageous for sustaining a plating voltage without significant IR drop across the area of a substrate. The first metallization material layer is also advantageously deposited to a thickness that is significantly greater than thicknesses typical of a wet deposition process. For some metallization material layer compositions, the PVD process results in columnar grain growth within the first metallization material layer. Such columnar grain growth generally forms larger grains as layer thicknesses increase.

Methods 100 continue at block 120 where one or more mask materials are applied over the first metallization material layer. Openings are formed in the mask material, exposing a first portion of the first metallization material layer where another metallization material layer is to be formed. The mask material(s) may be entirely sacrificial, such as any photoresist that may be lithographically patterned. Alternatively, some of the mask material may instead be retained as a permanent package dielectric that is similarly photodefinable and generally known as a photoimagable dielectric (PID) material.

With the openings defined, methods 100 continue at block 130 where a second metallization material layer is deposited in contact with the first portion of the first metallization material layer exposed within the mask openings. The second metallization material layer has a composition that is different than that of the first metallization material layer. In exemplary embodiments, the second metallization material layer comprises Cu, and is advantageously predominantly Cu. Hence, the package metallization deposited at this point comprises multiple metallization material layers having distinct chemical compositions.

In some embodiments, block 130 entails a Cu plating process, which may be either electroless or electrolytic. For electroless embodiments, the first metallization material layer has a surface chemistry that will initiate the electroless deposition of the second metallization material layer. For electrolytic embodiments, the first metallization material layer is sufficiently conductive to serve as a seed layer that will support electrolytic plating of the second metallization layer. For either electroless or electrolytic plating embodiments, the second metallization material layer is advantageously deposited to a thickness exceeding that of the first metallization material layer. The second metallization material layer may therefore represent the bulk of a line metallization feature to provide high electrical conductivity not possible with only the first metallization material layer.

In exemplary embodiments, line metallization is formed at block 130 according to the openings formed at block 120. Blocks 120 and 130 may be iterated, for example with any multiple (e.g., double) patterning process to first form line metallization according to one mask pattern and then further form via metallization over the line metallization according to another mask pattern. One or more mask materials may be deposited and patterned according to any techniques known to be suitable for multiple patterning semi-additive processing.

Figure 3:
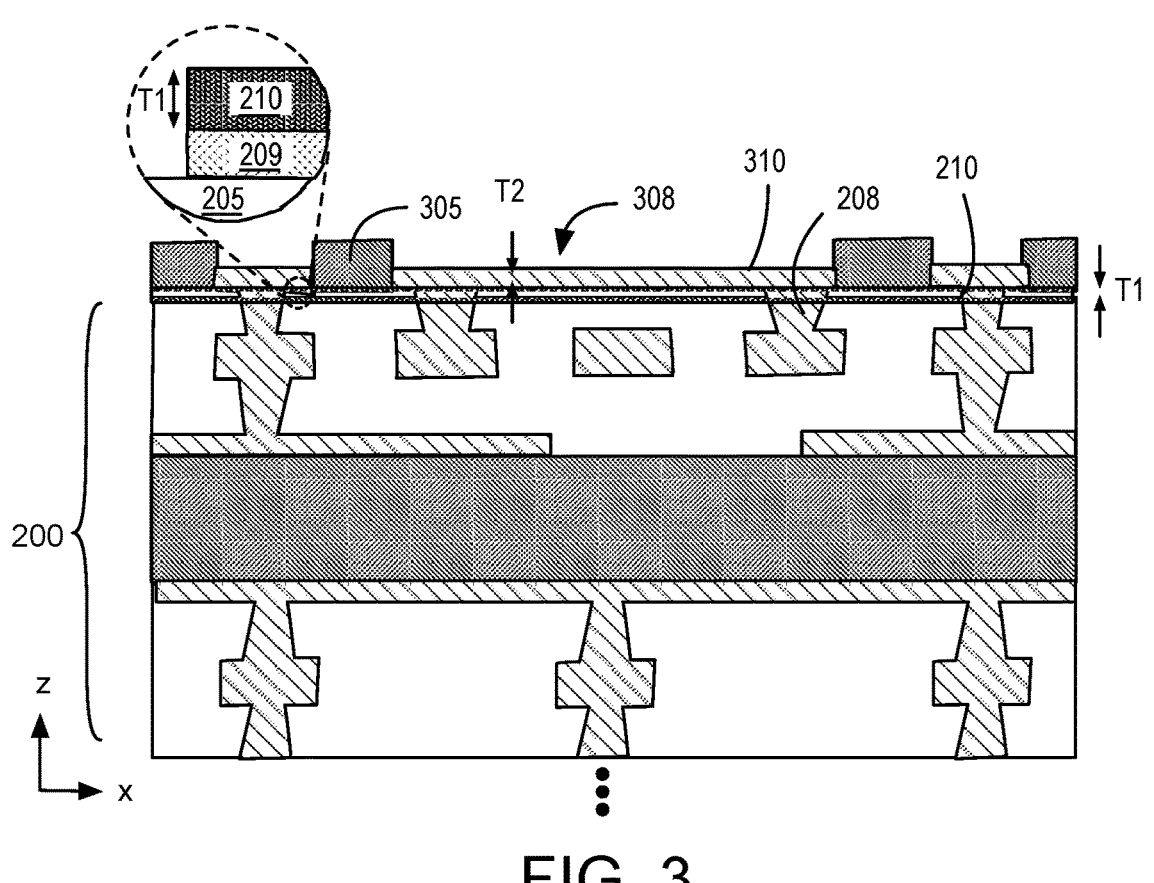

In the example further illustrated in FIG. 3, a metallization material layer 210 has been deposited upon package substrate 200. Metallization material layer 210 advantageously substantially comprises one or more other metals that are amenable to a subtractive patterning process, and that have sufficient electrical conductivity and/or offer a catalytic surface chemistry. Metallization material layer 210 has a non-zero thickness T1. As shown, material layer 210 is continuous over a line length between at least two underlying vias 208. While thickness T1 may be as little as a few tens of nm, thickness T1 is advantageously at least 100 nm, and more advantageously at least 500 nm. Thickness T1 may be 1 μm, or more, as the upper limit of thickness is constrained primarily by the total resistance permissible for a metal line of a given total thickness and line width.

Metallization material layer 210 may be substantially free of Cu. In some embodiments, metallization material layer 210 comprises one or more of Pd, Ru, Pt, Ti, or Au. Metallization material layer 210 is advantageously predominantly Pd or Ru as the inventors have found each to have good electrical conductivity, offer advantageous surface chemistry, and is amenable to subtractive etch techniques. Metallization material layer 210 is most advantageously predominantly Ru, which has been found to have superior electrical properties and subtractive patterning performance. For embodiments where metallization material layer 210 has been sputter deposited, metallization material layer 210 may have a polycrystalline microstructure with columnar grains and a texture associated with most grains being oriented substantially normal to an x-y plane of substrate 200. Accordingly, most columnar grains may have a longitudinal axis substantially coincident with the z-axis of FIG. 3.

As further illustrated in the expanded view inset of FIG. 3, metallization material layer 210 may be in contact with an intervening adhesion material layer 209 that is between metallization material layer 210 and package dielectric material 205. In some embodiments, adhesion material layer 209 comprises one or more metals, such as Ti, Pd, Ru, Pt, Au, Sn, Ag or W, and may be a metallic compound further comprising a non-metal, such as nitrogen (e.g., TiN). For embodiments lacking adhesion material layer 209, metallization material layer 210 is in direct contact with package dielectric material 205 and via metallization 208.

Mask material 305 is over a first portion of metallization material layer 210. Another line metallization material layer 310 is over a second portion of metallization material layer 210 exposed within openings of mask material 305 where lines or traces are desired. Line metallization material layer 310 has a different composition than metallization material layer 310 and is advantageously predominantly copper for advantageously low electrical resistance. If electrolessly deposited, line metallization material layer 310 may comprise a concentration of impurities that is greater than if line metallization material layer 310 is deposited electrolytically. Microstructure of line metallization material layer 310 may also vary as a function of the deposition process practiced. Line metallization material layer 310 has a thickness T2, which is advantageously greater than thickness T1, for example so that the portion of total line thickness having the composition of highest electrical conductivity is maximized for lowest effective line resistance. In exemplary embodiments, thickness T2 is at least twice the thickness T1 and may be, for example 1 μm, or more. In some embodiments, thickness T2 is advantageously at least 2 μm, and may be as much as 3-15 μm, depending on design rules applicable for a given implementation.

Figure 4:
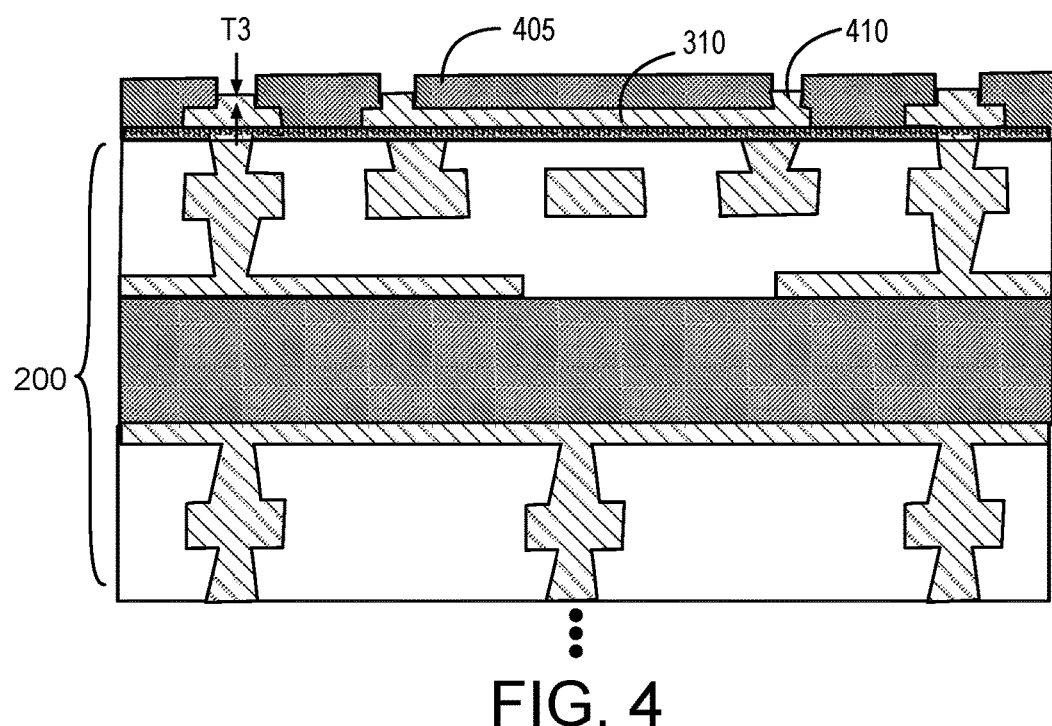

FIG. 4 further illustrates an example where another mask material 405 is over a portion of line metallization material layer 310. Mask material 405 is illustrated as replacing mask material 305 (FIG. 3), but mask material 405 may instead supplement a previously applied mask material. A via metallization material layer 410 is over a portion of line metallization material layer 310 exposed within openings of mask material 405 where conductive vias are desired. In exemplary embodiments, via metallization material layer 410 has substantially the same composition as line metallization material layer 310 (e.g., predominantly Cu). However, via metallization material layer 410 may instead have a chemical composition distinct from that of line metallization material layer 310. Via metallization material layer 410 has a thickness T3, which is also advantageously greater than thickness T1. In exemplary embodiments, thickness T3 is at least twice the thickness T1 and may be, for example 1 μm, or more. In some embodiments, thickness T3 is advantageously at least 2 μm, and may as much as 3-15 μm.

Returning to FIG. 1, methods 100 continue at block 135 where at least some of the mask material is removed to expose a second portion of the first metallization material layer. In these locations the first metallization material layer is removed at block 140 to complete the delineation of line metallization features. In exemplary embodiments, portions of the first metallization material layer are removed with an etch process that is selective to the chemical composition of the first metallization material layer. Advantageously, the etch process does not significantly etch, pit, or otherwise roughen surfaces of the overlying line metallization material layer and/or via metallization material layer. In some examples where a line metallization material layer is predominantly Cu and the first metallization material layer comprises metal other than Cu, the first metallization material layer may be patterned with an etchant that etches the Cu-based metallization at a rate of no more than 0.05 μm/min. Accordingly, the line metallization material layer retains its lateral dimensions as initially defined by the deposition mask. The line metallization material layer may also retain a low average surface roughness (e.g., Ra<100 nm, and more advantageously <30 nm).

Any etch process offering sufficient selectivity to the first metallization material layer may be practiced at block 140. In some embodiments, an isotropic etch process, which may be a wet chemical or dry plasma process suitable for the composition, is practiced at block 140 to etch through the thickness of the first metallization material layer in any region not protected by line metallization material. In other embodiments, an anisotropic etch process, which may be any reactive ion etch (RIE) process suitable for the composition, is practiced at block 140 to etch through the thickness of the first metallization material layer in any region not protected by line metallization material. Any adhesion layer, particularly if electrically conductive, may also be removed by any suitable etch process at block 142. Ideally, the etch process performed at block 142 is also selective to the composition of the adhesion layer.

Methods 100 then end at output 145 where the IC device package metallization structure is completed, for example by depositing additional package insulator(s) over features of the metallization level fabricated through the practice of blocks 112-142. In some embodiments, any of the material layers described above may be deposited or otherwise applied to further build-up the package substrate in preparation for an assembly of one or more IC dies, as further described below. Completing the package metallization structure may further entail performing another iteration of blocks 112-142 to form one or more additional metallization levels, and/or by performing one or more other methods to form one or more additional metallization levels. Downstream of output 145, a first side of the completed package metallization structure may be interconnected to any number of IC die while a second side of the completed package may be interconnected to any suitable host component.

Figure 5:
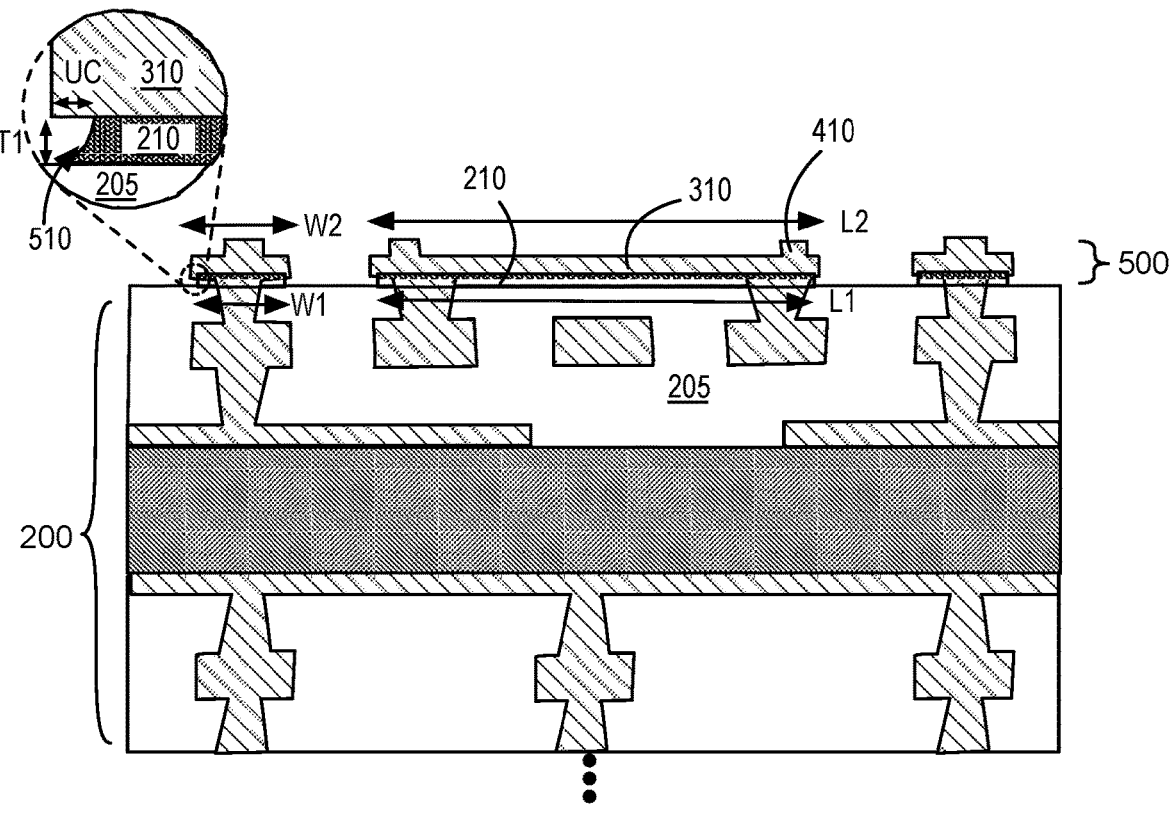

In the example further illustrated in FIG. 5, metallization material layer 210 is removed from regions not protected by line metallization material layer 310 to delineate metallization features within a single package metallization level 500. As shown in the expanded view inset, the etch process has undercut line metallization material layer 310, highlighting the selectively of the etch process. In this isotropic etch example, metallization material layer 210 has a sloped or curved (e.g., scalloped or hour-glassed) sidewall profile 510 with the largest amount of lateral undercut, UC, proximal to line metallization material layer 310. In the illustrated embodiment, lateral undercut UC is approximately equal to thickness T1 of metallization material layer 210. As further illustrated in FIG. 5, because of the lateral undercut, metallization features comprise a metallization material layer 210 that has a longitudinal length L1, which is significantly shorter than the longitudinal length L2 of line metallization material layer 310. For example, L1 may be less than L2 by substantially twice the lateral undercut UC. FIG. 5 further illustrates metallization features comprise a metallization material layer 210 with a transverse width W1, which is significantly smaller than the transverse width W2 of line metallization material layer 310. For example, W1 may also be less than W2 by substantially twice the lateral undercut UC.

Figure 6:
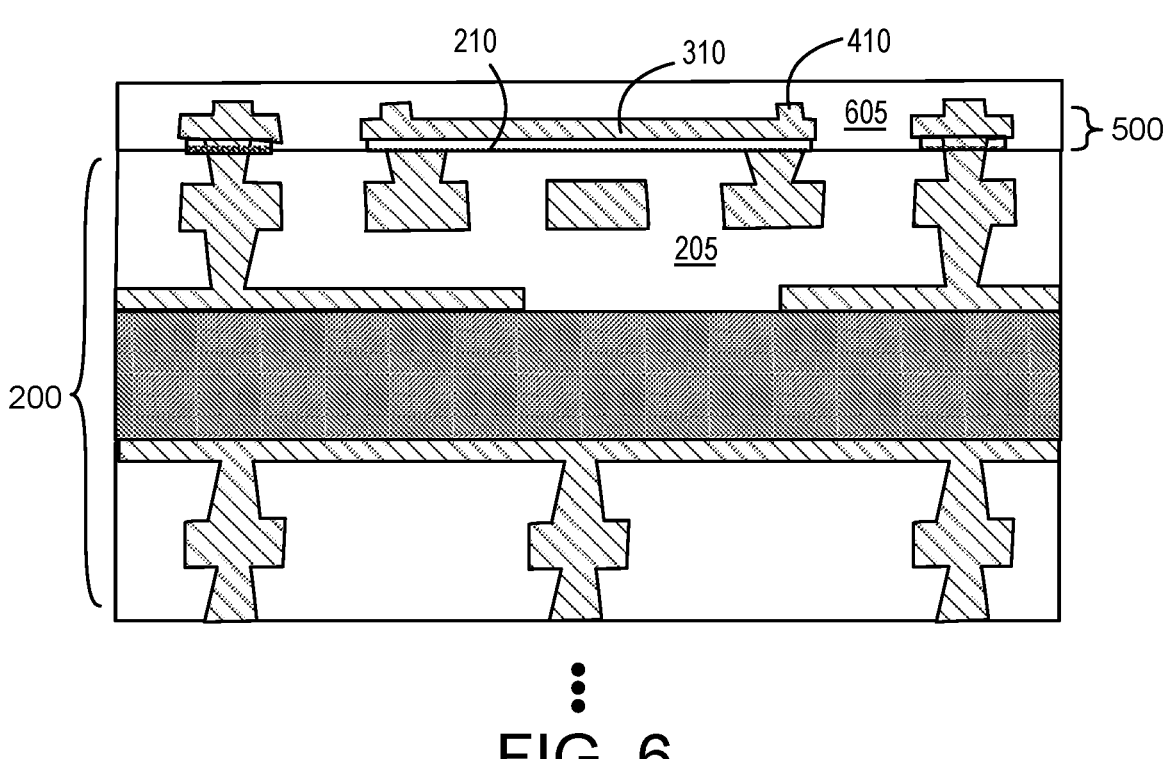
Figure 7:
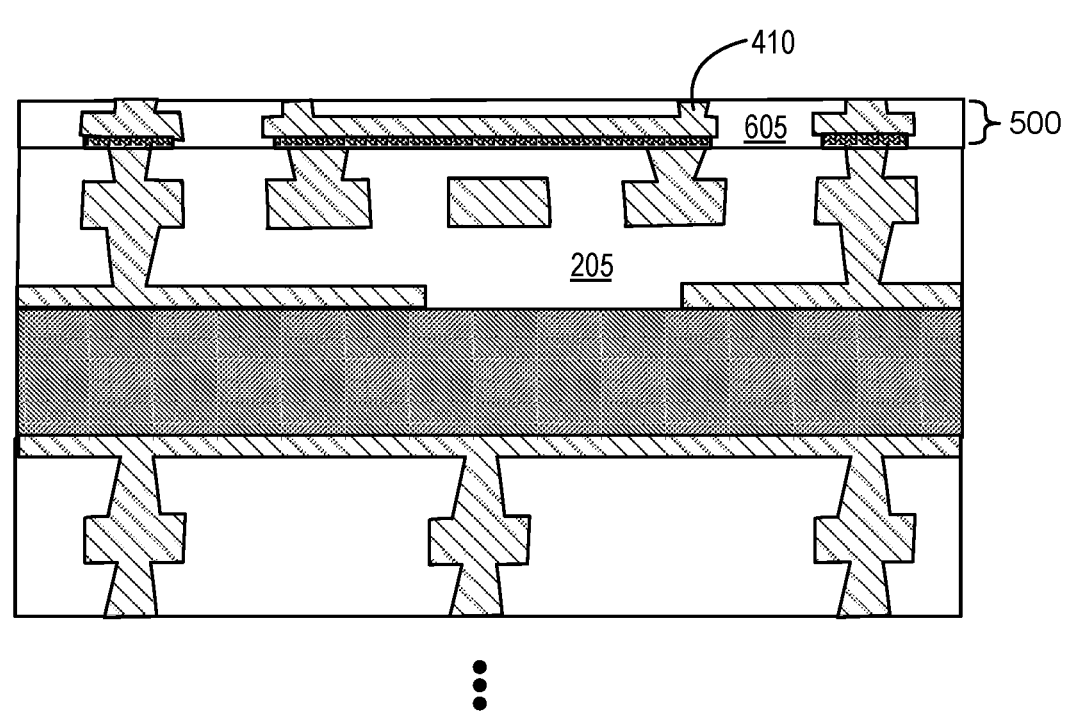

FIG. 6 illustrates formation of an insulator 605 over features of metallization level 500. Insulator 605 may be any of the organic dielectric materials described above for insulator 205, for example. Insulator 605 may have been applied by liquid dispense followed by a curing process, or applied as a dry film laminate, for example. FIG. 7 further illustrates a planarization of insulator 605 with a surface via metallization layer 410. Both line metallization material layer 310 and metallization material layer 210 are therefore fully embedded within insulator 205 and/or insulator 605.

Figure 8:
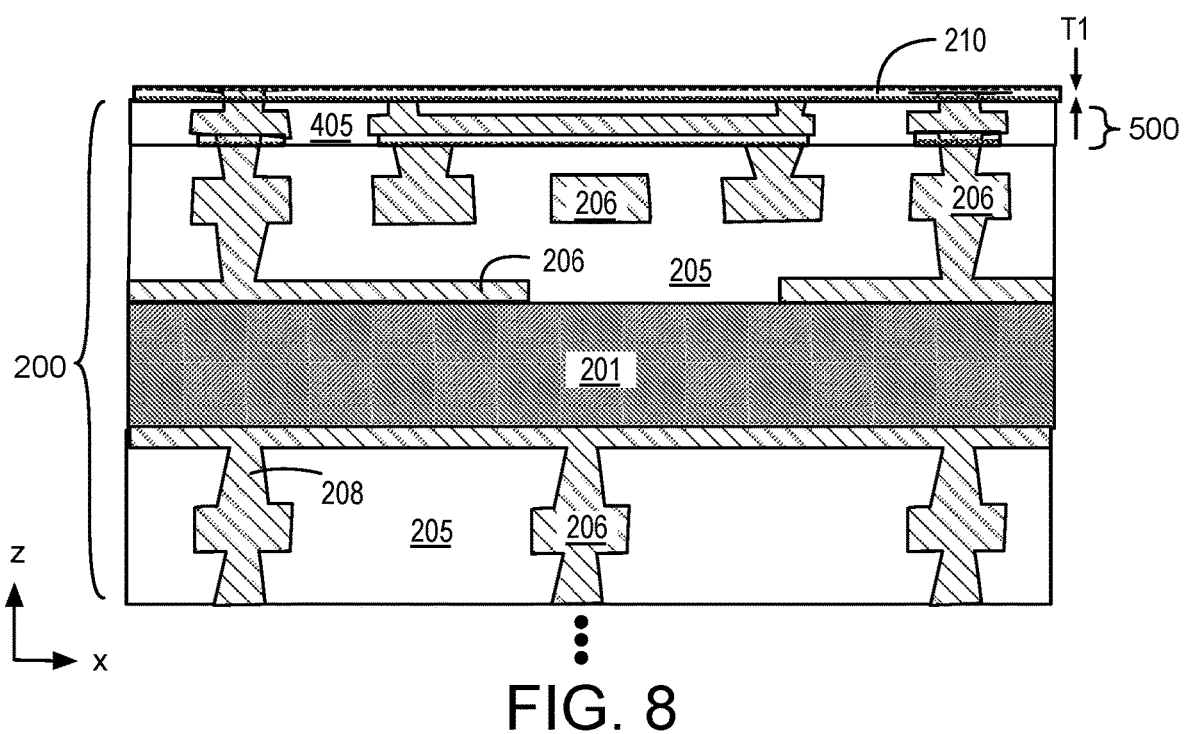

FIGS. 8-15 further illustrate the build-up of another package metallization level, which may be fabricated by practicing a second iteration of methods 100 (FIG. 1), for example. In FIG. 8, package substrate 200 now includes multi-layered metallization level 500 over one or more metallization levels that lack the compositionally distinct metallization material layers described above for multi-layered metallization level 500. Another metallization material layer 210 has been formed over at least a first side of substrate 200 and may have also been formed on the opposite side (not depicted). Metallization material layer 210 may have any of the material and/or layer properties described above.

Figure 9:
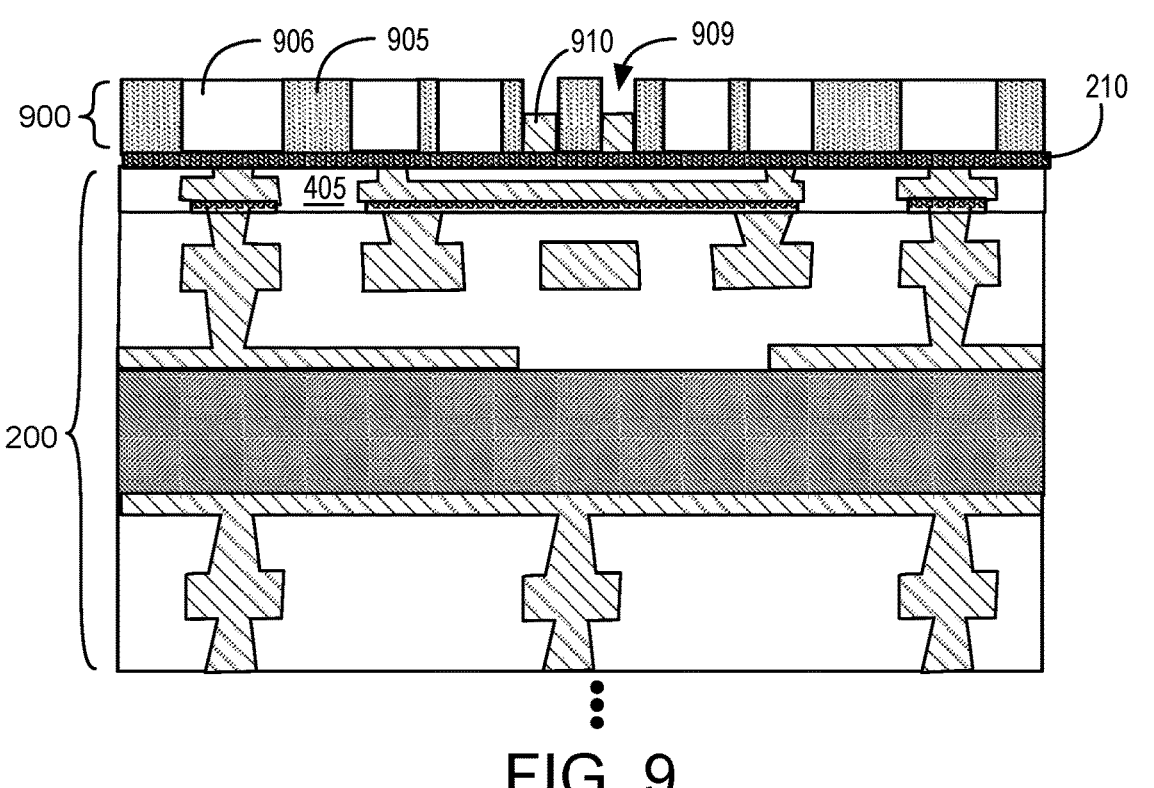

FIG. 9 further illustrates a multi-patterned mask 900 over metallization material layer 210. Multi-patterned mask 900 includes first mask regions 905 and second mask regions 906. Mask openings 909 are located with a third region of multi-patterned mask 900. Another metallization material layer 910 at least partially fills mask openings 909. Metallization material layer 910 may have any of the material and/or layer properties described above for line metallization material layer 310, and may have been electrolytically plated, for example. In this example, mask openings 909 have lateral dimensions suitable for vias rather than lines.

Figure 10:
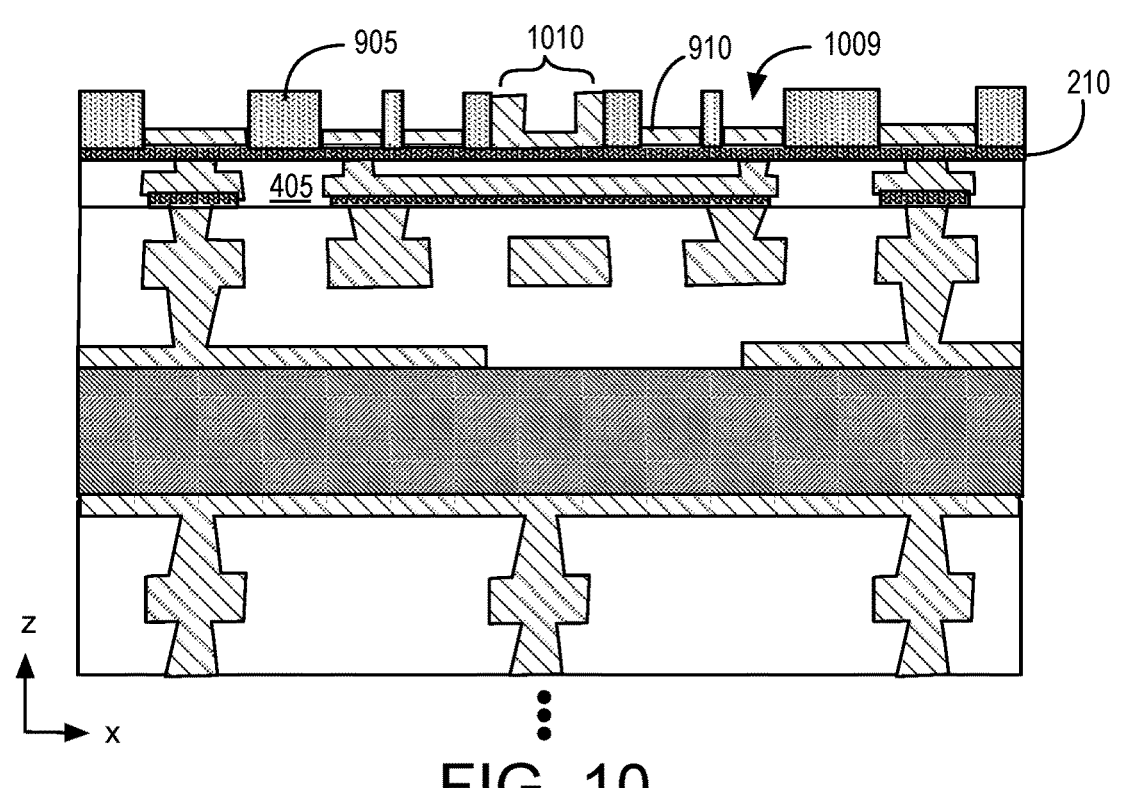

FIG. 10 further illustrates multi-patterned mask 900 with mask openings 1009 now exposing another portion of metallization material layer 210 following a removal (e.g., developing) of second mask regions 906. Metallization material layer 910 at least partially fills mask openings 1009. Metallization material layer 910 may have been augmented in the manner illustrated, for example with an electrolytic plating process or electroless plating process. Mask openings 1009 have lateral dimensions defining lines. For metallization structure 1010, a longitudinal length (e.g., along x-axis) of the line metallization spans two via metallizations and is self-aligned to the two via metallizations such that there is no misalignment error between the via metallizations and line metallizations. The zero-misalignment patterning process illustrated in FIG. 8-10 may complement the multiple layers of metallization material, furthering the goal of greater line metallization density as via misalignment tolerances can be dropped from the routing design rules.

Figure 11:
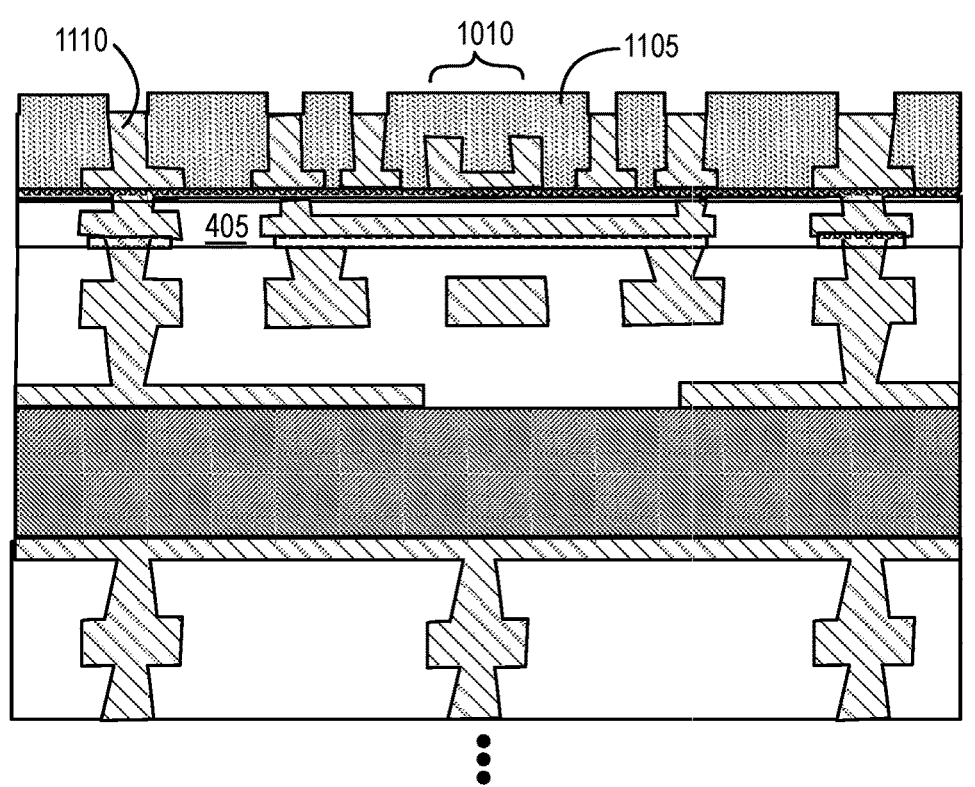

In FIG. 11, a mask material 1105 is over metallization material layer 910 as well as metallization structure 1010. Additional metallization material at least partially fills openings in mask material 1105, further augmenting metallization material layer 910 previously deposited to form other via metallization that is aligned to line metallization. Accordingly, FIG. 11 illustrates how multiple patterning operations may be practiced to form via metallization. However, all via metallization of one metallization level may also be fabricated according to either a self-aligned, or a non-self-aligned, technique.

Figure 12:
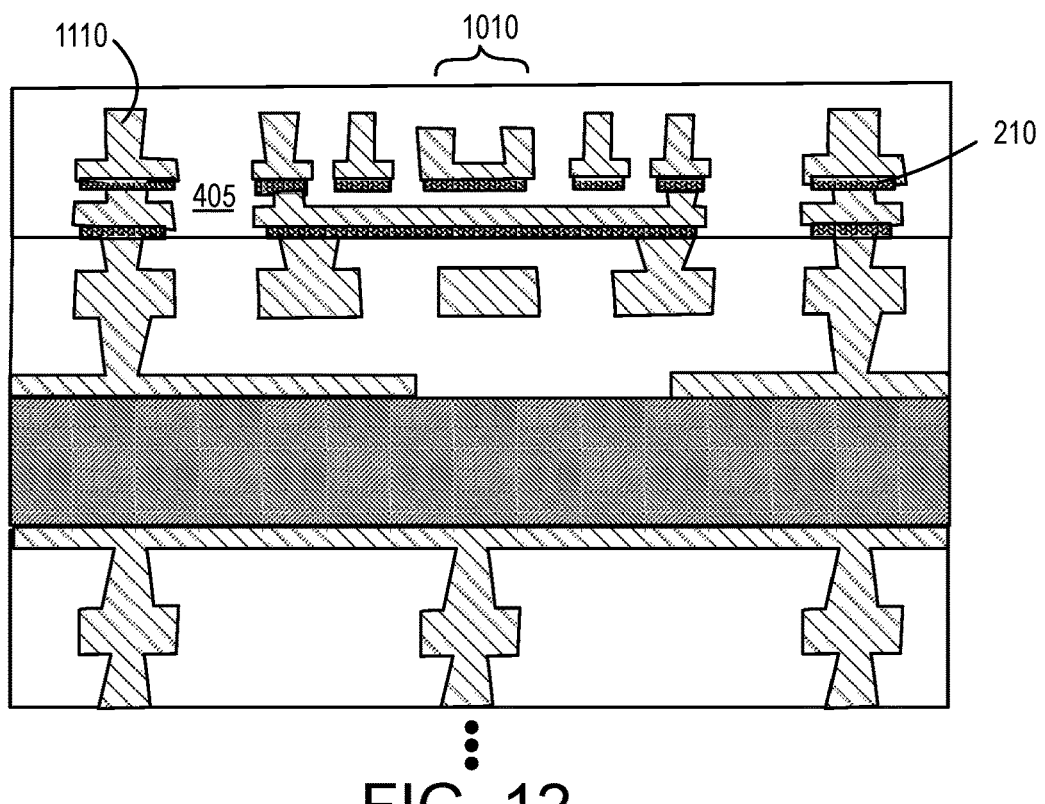
Figure 13:
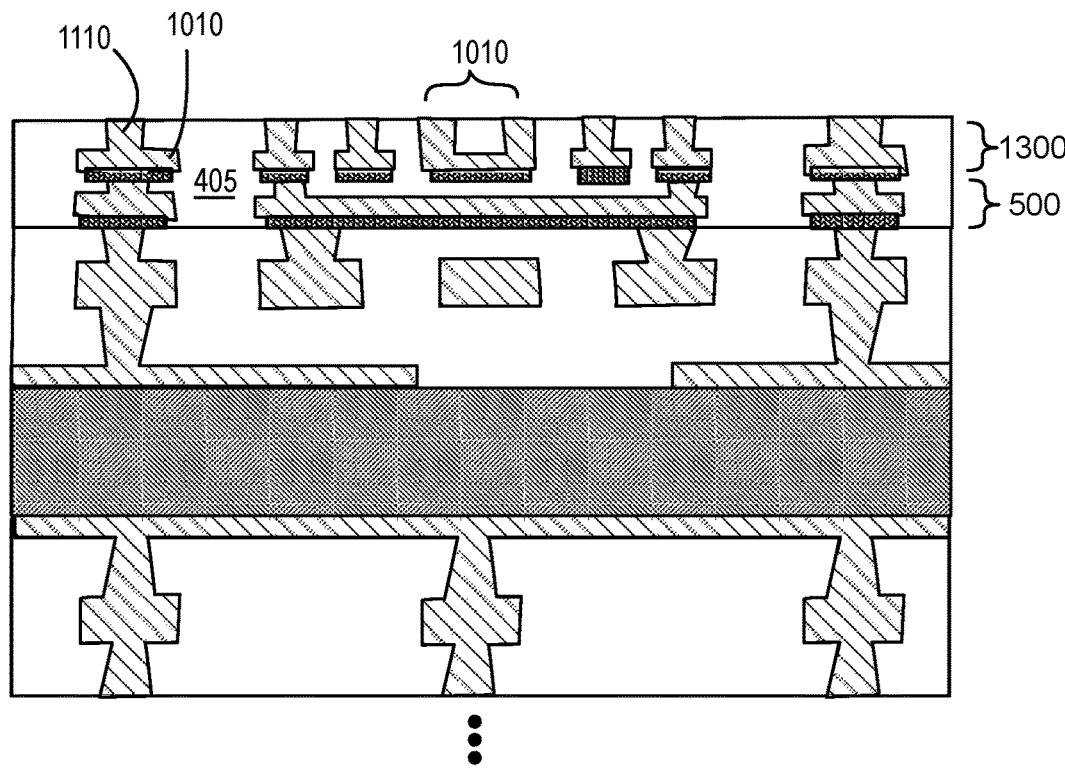

In FIG. 12, metallization material layer 210 has been patterned into line metallization, for example with a selective etch process substantially as described elsewhere herein. Additional insulator 405 has been formed over metallization feature 1010. In FIG. 13, insulator 405 has been planarized to arrive at a metallization level 1300 that includes both self-aligned metallization features (e.g., 1010) and non-self-aligned metallization features (e.g., 1110).

Figure 14:
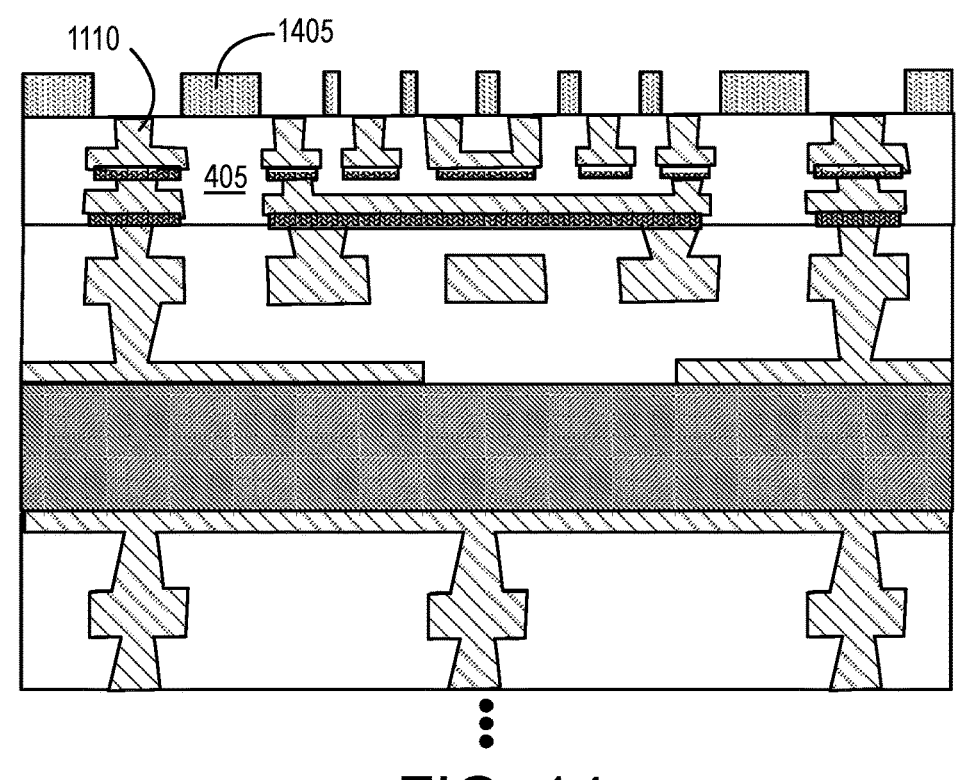
Figure 15:
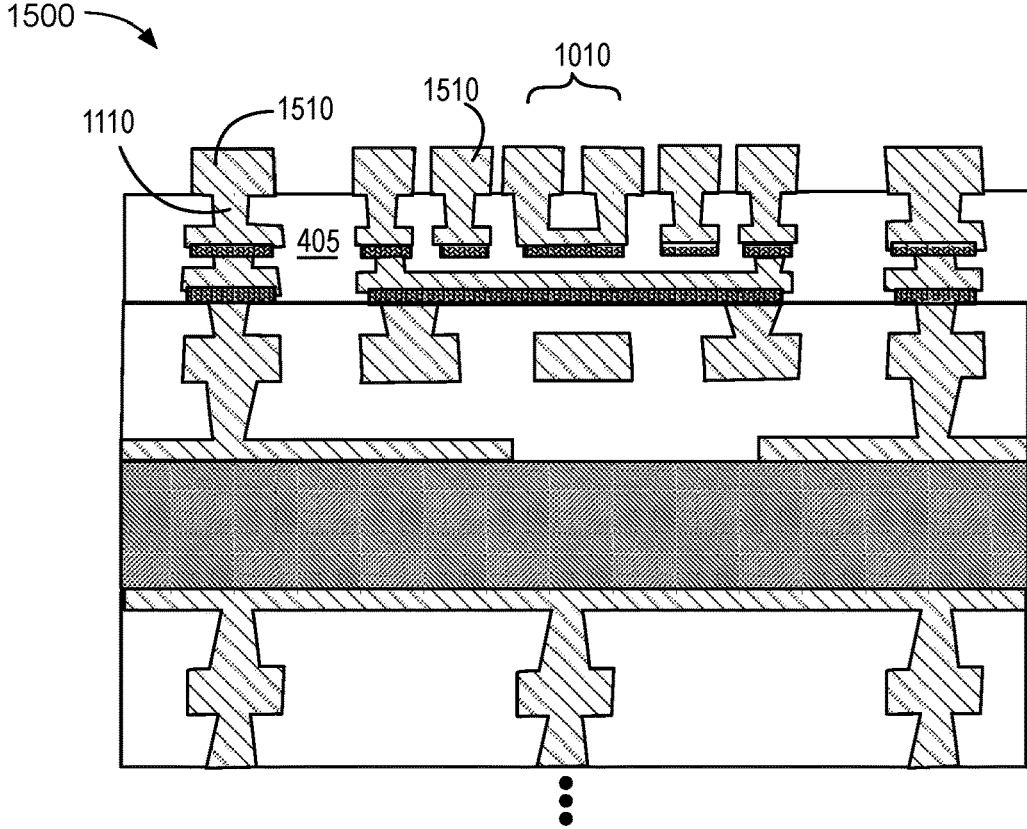

A package metallization structure including one or more metallization level having multiple metallization material layers may include any IC die interconnects known to be suitable for the package materials. FIG. 14-15 further illustrate one example where a mask material 1405 is patterned with openings to define interconnect pillars 1510 that are to interconnect with an IC die assembled into the package. In some embodiments, interconnect pillars 1510 are predominantly Cu. However, interconnects may instead comprise solder and/or other metallization. IC die package 1500 is then substantially complete and ready for assembly. In advantageous embodiments further described below, IC die package 1500 is assembled with multiple IC die that will interconnect to each other through the multi-layered metallization features of IC die package 1500.

Figure 16:
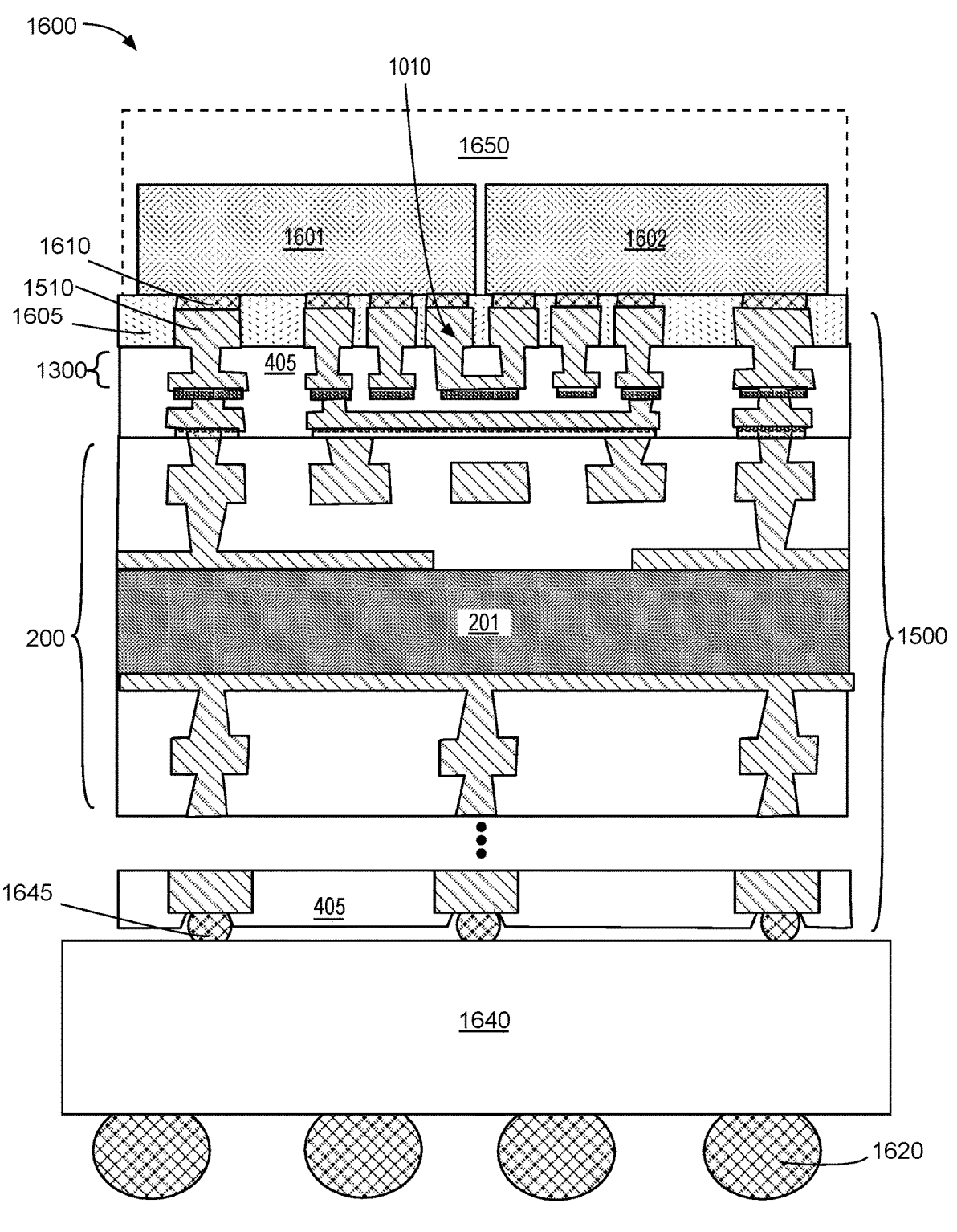
FIG. 16 illustrates a system including an IC device package interconnecting two IC die, in accordance with some embodiments.

FIG. 16 illustrates a system 1600 including IC device package 1500 interconnecting two IC die 1601 and 1602 (chips or chiplets) to each other, in accordance with some embodiments. In exemplary embodiments, at least IC die 1601 includes microprocessor circuitry, graphics processing circuitry, or heterogeneous processing circuitry. Microprocessor circuitry may be operable, for example, to execute a real-time operative system (RTOS). In some further embodiments, at least IC die 1601 is operable to execute one or more layers of a software stack that controls radio (wireless) functions. In some further embodiments, at least IC die 1602 includes electronic memory circuitry, such as, but not limited to, dynamic random-access memory (DRAM). In other embodiments, both of IC die 1601 and 1602 include memory circuitry, or both of IC die 1601 and 1602 include microprocessor circuitry.

In the example depicted in FIG. 16, IC die 1601 and 1602 are each attached to package metallization. In some examples, package interconnects 1510 are coupled to IC die interconnects 1610, which may comprise solder features, for example. In other embodiments, package interconnects 1510 are solderlessly coupled to IC die interconnects 1610. For example, IC die interconnect 1610 may comprise one or more layer of metallization, such as gold and/or nickel, that makes direct contact with package interconnects 1610.

Notably, multi-layered metallization feature 1010 interconnects IC die 1601 to the adjacent IC die 1602 as the higher metallization line density possible with a multi-layered metallization satisfies the pitch requirements for high density interconnects between the multiple IC die assembled to the package metallization structure. The lower average surface roughness of multi-layered metallization feature 1010 may also enable one or more levels of package metallization to provide high density interconnects between multiple IC die with low insertion losses. Lower levels of metallization within IC die package 1500 lacking such multi-layered metallization may suffice for delivery of power to IC die 1601 and 1602.

As further illustrated in FIG. 16, a package dielectric 1605 is between package 1500 and IC dies 1601 and 1602. Package dielectric 1605 may have substantially the same composition as insulator 405, or package dielectric 1605 may have a different composition. In some embodiments, package dielectric 1605 is a mold compound or capillary underfill material. In the illustrated example, package dielectric 1605 occupies spaces between package interconnects 1510.

Host component 1640 may be a PCB or interposer attached to the package metallization through any suitable interconnect 1645. In some exemplary embodiments, a land-side of the host component 1640 opposite IC die 1601, 1602 is further processed to form at least an interface to receive second level interconnects 1620. System 1600 may further include one or more of an overmold, a heat spreader, or active cooling structure 1650.

Figure 17:
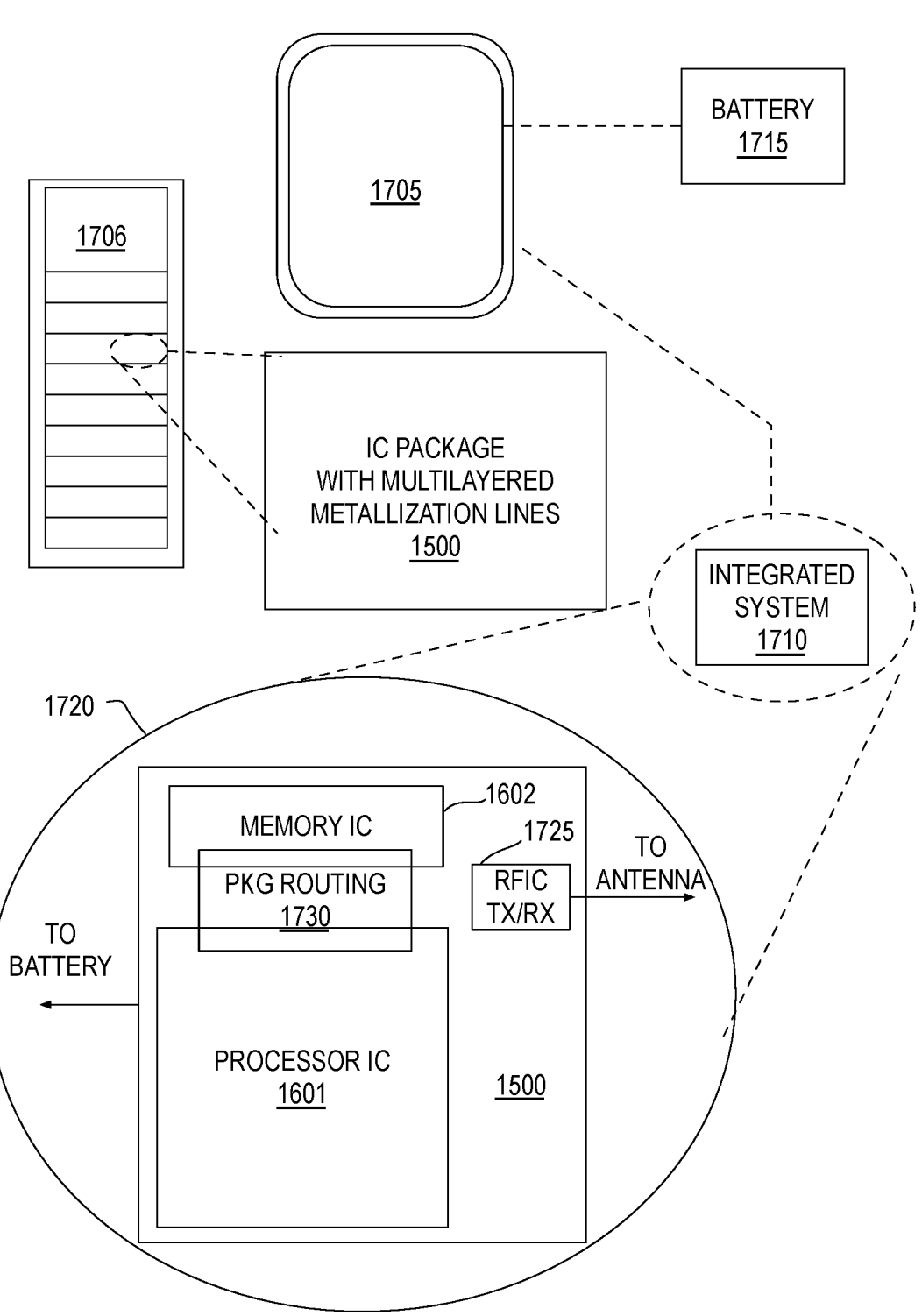
FIG. 17 illustrates a mobile computing platform and a data server machine employing package routing with multi-layered metallization lines, in accordance with embodiments.

FIG. 17 illustrates a mobile computing platform and a data server machine employing package routing with multi-layered line metallization, for example as described elsewhere herein. The server machine 1706 may be any commercial server, for example including any number of high-performance computing platforms disposed within a rack and networked together for electronic data processing. The mobile computing platform 1705 may be any portable device configured for each of electronic data display, electronic data processing, wireless electronic data transmission, or the like. For example, the mobile computing platform 1705 may be any of a tablet, a smart phone, laptop computer, etc., and may include a display screen (e.g., a capacitive, inductive, resistive, or optical touchscreen), a chip-level or package-level integrated system 1710, and a battery 1715.

As a system component within the server machine 806, a memory IC (e.g., RAM) die 1602 and a processor IC (e.g., a microprocessor, a multi-core microprocessor, baseband processor, or the like) die 1601 are interconnected through a package routing structure 1730 that further includes multi-layered line metallization, for example substantially as described elsewhere herein. One or more other IC die may also be assembled with package 1500. For example, a RF (wireless) integrated circuit (RFIC) 1725 including a wideband RF (wireless) transmitter and/or receiver (TX/RX) may be further interconnected to package 1500. Functionally, RFIC 1725 may have an output coupled to an antenna to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 18:
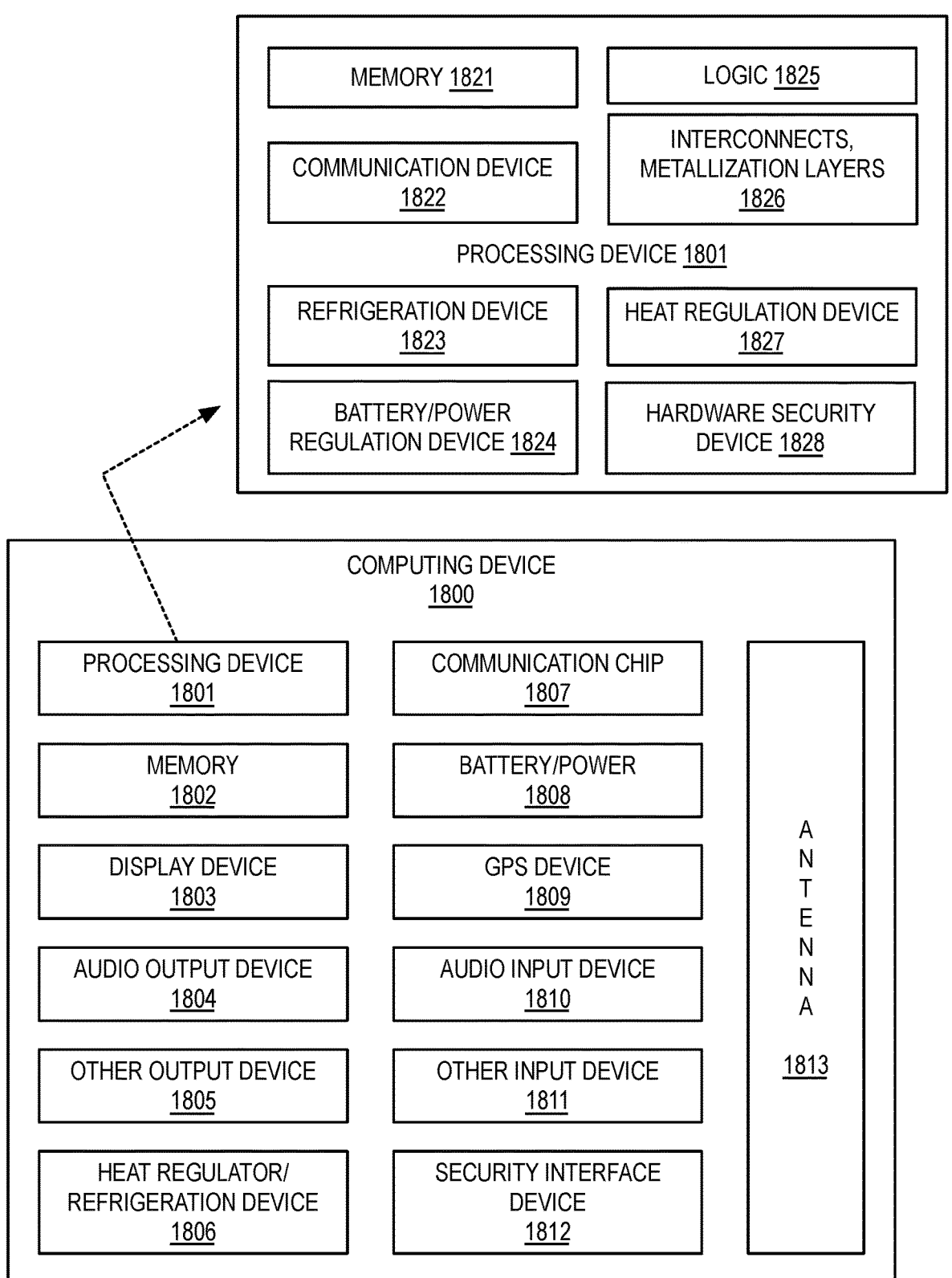
FIG. 18 is a functional block diagram of an electronic computing device, in accordance with some embodiments.

FIG. 18 is a block diagram of a cryogenically cooled computing device 1800 in accordance with some embodiments. For example, one or more components of computing device 1800 may include any of the devices or structures discussed elsewhere herein. A number of components are illustrated in FIG. 18 as included in computing device 1800, but any one or more of these components may be omitted or duplicated, as suitable for the application. In some embodiments, some or all of the components included in computing device 1800 may be attached to one or more printed circuit boards (e.g., a motherboard). In some embodiments, various ones of these components may be fabricated onto a single system-on-a-chip (SoC) die. Additionally, in various embodiments, computing device 1800 may not include one or more of the components illustrated in FIG. 18, but computing device 1800 may include interface circuitry for coupling to the one or more components. For example, computing device 1800 may not include a display device 1803, but may include display device interface circuitry (e.g., a connector and driver circuitry) to which display device 1803 may be coupled.

Computing device 1800 may include a processing device 1801 (e.g., one or more processing devices). As used herein, the term processing device or processor indicates a device that processes electronic data from registers and/or memory to transform that electronic data into other electronic data that may be stored in registers and/or memory. Processing device 1801 may include a memory 1821, a communication device 1822, a refrigeration/active cooling device 1823, a battery/power regulation device 1824, logic 1325, interconnects 1826, a heat regulation device 1827, and a hardware security device 1828.

Processing device 1801 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Processing device 1801 may include a memory 1802, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1821 includes memory that shares a die with processing device 1802. This memory may be used as cache memory and may include embedded dynamic random-access memory (eDRAM) or spin transfer torque magnetic random-access memory (STT-M RAM).

Computing device 1800 may include a heat regulation/refrigeration device 1823. Heat regulation/refrigeration device 1823 may maintain processing device 1802 (and/or other components of computing device 1800) at a predetermined low temperature during operation. This predetermined low temperature may be any temperature discussed elsewhere herein.

In some embodiments, computing device 1800 may include a communication chip 1807 (e.g., one or more communication chips). For example, the communication chip 1807 may be configured for managing wireless communications for the transfer of data to and from computing device 1800. The term "wireless" and its derivatives may be used to describe circuits, devices, systems, methods, techniques, communications channels, etc., that may communicate data through the use of modulated electromagnetic radiation through a nonsolid medium.

Communication chip 1807 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1307 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1307 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1107 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1807 may operate in accordance with other wireless protocols in other embodiments. Computing device 1800 may include an antenna 1813 to facilitate wireless communications and/or to receive other wireless communications (such as AM or FM radio transmissions).

In some embodiments, communication chip 1807 may manage wired communications, such as electrical, optical, or any other suitable communication protocols (e.g., the Ethernet). As noted above, communication chip 1807 may include multiple communication chips. For instance, a first communication chip 1807 may be dedicated to shorter-range wireless communications such as Wi-Fi or Bluetooth, and a second communication chip 1807 may be dedicated to longer-range wireless communications such as GPS, EDGE, GPRS, CDMA, WiMAX, LTE, EV-DO, or others. In some embodiments, a first communication chip 1807 may be dedicated to wireless communications, and a second communication chip 1807 may be dedicated to wired communications.

Computing device 1800 may include battery/power circuitry 1808. Battery/power circuitry 1808 may include one or more energy storage devices (e.g., batteries or capacitors) and/or circuitry for coupling components of computing device 1300 to an energy source separate from computing device 1800 (e.g., AC line power).

Computing device 1800 may include a display device 1803 (or corresponding interface circuitry, as discussed above). Display device 1803 may include any visual indicators, such as a heads-up display, a computer monitor, a projector, a touchscreen display, a liquid crystal display (LCD), a light-emitting diode display, or a flat panel display, for example.

Computing device 1800 may include an audio output device 1804 (or corresponding interface circuitry, as discussed above). Audio output device 1804 may include any device that generates an audible indicator, such as speakers, headsets, or earbuds, for example.

Computing device 1800 may include an audio input device 1810 (or corresponding interface circuitry, as discussed above). Audio input device 1810 may include any device that generates a signal representative of a sound, such as microphones, microphone arrays, or digital instruments (e.g., instruments having a musical instrument digital interface (MIDI) output).

Computing device 1800 may include a global positioning system (GPS) device 1809 (or corresponding interface circuitry, as discussed above). GPS device 1809 may be in communication with a satellite-based system and may receive a location of computing device 1800, as known in the art.

Computing device 1800 may include another output device 1805 (or corresponding interface circuitry, as discussed above). Examples include an audio codec, a video codec, a printer, a wired or wireless transmitter for providing information to other devices, or an additional storage device.

Computing device 1800 may include another input device 1811 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1800 may include a security interface device 1812. Security interface device 1812 may include any device that provides security measures for computing device 1800 such as intrusion detection, biometric validation, security encode or decode, managing access lists, malware detection, or spyware detection.

Computing device 1800, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

While certain features set forth herein have been described with reference to various implementations, this description is not intended to be construed in a limiting sense and additional examples are therefore provided below.

In first examples an integrated circuit (IC) device package comprises a substrate comprising a dielectric material a metallization line extending over the dielectric material, wherein the metallization line comprises a first layer comprising a first metal and having a first thickness of at least 100 nm. The metallization line comprises a second layer on the first layer. The second layer comprises a second metal, different than the first metal, and has a second thickness greater than the first thickness.

In second examples, for any of the first examples the first layer is continuous over a length of the one or more metallization lines.

In third examples, for any of the first through second examples the first layer is predominantly the first metal, and the first metal is at least one of Pd, Ru, Pt, Ti, or Au.

In fourth examples, the first metal is Pd or Ru.

In fifth examples, the first metal is Ru.

In sixth examples, for any of the first through fifth examples the metallization line is to electrically interconnect a first IC die to a second IC die.

In seventh examples, for any of the first through sixth examples the first layer has a first line length and a first line width, while the second layer has a second line length and second line width. The second line length is longer than the first line length by substantially the same amount the second line width is wider than the first line width.

In eighth examples, for any of the first through seventh examples the first layer has columnar grain texture oriented substantially normal to a plane of the substrate.

In ninth examples, for any of the first through eighth examples the metallization line further comprises a third layer between the dielectric material and the first layer of the metallization lines, the third layer comprising a third metal, different than the first or second metals.

In tenth examples, for any of ninth examples the third layer comprises at least one of Ti, Pd, Ru, Pt, Au, Sn, Ag, W or nitrogen.

In eleventh examples, for any of the first through tenth examples the metallization line is within a first metallization level and the device package further comprises a second metallization level between the first metallization level and the substrate. The second metallization level comprises a second metallization line having a first layer comprising other than the first metal.

In twelfth examples, for any of the eleventh examples material layers of the second metallization line comprise predominantly Cu.

In thirteenth examples, one or more surfaces of the first metallization line have a lower average roughness than one or more surfaces of the second metallization line.

In fourteenth examples, a system comprises a first integrated circuit (IC) die, a second IC die and an integrated circuit (IC) device package, comprising a metallization line. The metallization line comprises a first layer at least partially over a dielectric material, wherein the first layer comprises predominantly Pd, Ru, Pt, Ti, or Au and has a first thickness of at least 100 nm. The metallization line comprises second layer in contact with the first layer, wherein the second layer comprises predominantly Cu, and has a second thickness, greater than the first thickness.

In fifteenth examples, for any of the fourteenth examples the metallization line interconnects the first IC die to the second IC die. The first and second IC die are over a first side of the IC device package, and a second side of the IC device package is coupled to a host component. The system further comprises a power supply coupled to the IC device package through an interconnect interface between the IC device package and the host component.

In sixteenth examples, for any of the fourteenth through fifteenth examples the first thickness is at least 500 nm, and the second thickness is at least 1 μm.

In seventeenth examples, a method of fabricating an integrated circuit (IC) device package comprises receiving a substrate comprising a dielectric material. The method comprises depositing a first material layer to a first thickness of at least 100 nm over the dielectric material. The first material layer comprises predominantly a first metal. The method comprises forming a line metallization by forming, to a second thickness, a second material layer on a first portion the first material layer. The second thickness is greater than the first thickness and the second material layer comprises predominantly a second metal, different than the first metal. The method comprises delineating the line metallization by removing a second portion of the first material layer with an etch process that is selective to the first metal relative to the second metal.

In eighteenth examples, for any of the seventeenth examples depositing the first material layer comprises sputter depositing Pd, Ru, Pt, Ti, or Au, and forming the second material layer comprises plating Cu upon the first portion of the first material layer.

In nineteenth examples, for any of the seventeenth through eighteenth examples the method comprises masking the second portion of the first material layer with a photodefinable material that is developed to expose the first portion of the first material layer within an opening of the photodefinable material.

In twentieth examples, for any of the seventeenth through nineteenth examples removing the second portion of the first material layer comprises undercutting an edge portion of the second material layer with the etch pro Hence, various modifications of the implementations described herein, as well as other implementations, which are apparent to persons skilled in the art to which the present disclosure pertains are deemed to lie within the spirit and scope of the present disclosure. It will be recognized that principles of the disclosure are not limited to the embodiments so described, but instead can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An integrated circuit (IC) device package, comprising:
a substrate comprising a dielectric material; and
a first metallization level comprising a plurality of metallization lines extending over the dielectric material, wherein each of the metallization lines comprises:
a first layer of predominantly a first metal that is other than Cu, the first layer extending a first line length over the dielectric material, having a first thickness over the dielectric material of at least 100 nm; and
a second layer on the first layer, wherein the second layer is a second metal that is predominantly Cu, the second layer extending at least the first line length over the dielectric material and having a second thickness over the first layer that is at least twice the first thickness.

2. The IC device package of claim 1, wherein the first layer is continuous over the first line length of each of the metallization lines.

3. The IC device package of claim 1, wherein the first metal is at least one of Pd, Ru, Pt, Ti, or Au.

4. The IC device package of claim 3, wherein the first metal is Pd or Ru.

5. The IC device package of claim 4, wherein the first metal is Ru.

6. The IC device package of claim 1, wherein each of the metallization lines is to electrically interconnect a first IC die to a laterally adjacent second IC die, wherein the metallization level comprises a plurality of metallization vias, wherein individual ones of the metallization vias are on a portion of corresponding ones of the metallization lines, and wherein the metallization vias are of the second metal.

7. The IC device package of claim 1, wherein:
the first layer has a first line width,
the second layer has a second line width;
the first line length is shorter than the second line length by an amount of lateral undercut by which the first line width is also narrower than the second line width; and
the amount of lateral undercut is at least equal to first thickness.

8. The IC device package of claim 1, wherein the first layer has columnar grain texture oriented normal to a plane of the substrate.

9. The IC device package of claim 1, wherein each of the metallization lines further comprises a third layer between the dielectric material and the first layer of the metallization line, the third layer comprising a third metal, different than the first or second metals.

10. The IC device package of claim 9, wherein the third layer comprises at least one of Ti, Pd, Ru, Pt, Au, Sn, Ag, W or nitrogen.

11. The IC device package of claim 1, wherein:

the device package further comprises a second metallization level between the first metallization level and the substrate; and the second metallization level comprises a second plurality of metallization lines comprising other than the first metal.

12. The IC device package of claim 11, wherein all material layers of each of the metallization lines of the second metallization level comprise predominantly Cu.

13. The IC device package of claim 12, wherein one or more surfaces of each of the metallization lines of the first metallization level have a lower average roughness (Ra) than one or more surfaces of each of the metallization lines of the second metallization level.

14. A system comprising:

a first integrated circuit (IC) die;

a second IC die; and an integrated circuit (IC) device package having a first side coupled to both of the first IC die and the second IC die and a second side coupled to a host component, the IC device package comprising a metallization line interconnecting the first IC die with the second IC die, and the metallization line comprising:

a first layer at least partially over a dielectric material, wherein the first layer comprises predominantly Pd, Ru, Pt, Ti, or Au and has a first thickness over the dielectric material of at least 500 nm; and a second layer in contact with the first layer, wherein the second layer comprises predominantly Cu, and has a second thickness over the dielectric material that is at least 1 μm.

15. The system of claim 14, wherein:

the system further comprises a power supply coupled to the IC device package through an interconnect interface between the IC device package and the host component.

16. The system of claim 14, wherein:

the first thickness is at least 500 nm; and the second thickness is 3-15 μm.

17. A method of fabricating an integrated circuit (IC) device package, the method comprising:

receiving a substrate comprising a dielectric material;

depositing a first material layer to a first thickness of at least 100 nm over the dielectric material, wherein the first material layer comprises predominantly Pd, Ru, Pt, Ti, or Au;

forming a line metallization by electrolytically plating, to a second thickness, a second material layer on a first portion the first material layer, wherein the second thickness is at least twice the first thickness and the second material layer comprises predominantly Cu; and delineating the line metallization by removing a second portion of the first material layer with an etch process that is selective to the first material layer relative to the second material layer, the etch process laterally undercutting an edge portion of the second material layer by at least the first thickness.

18. The method of claim 17, wherein:

depositing the first material layer comprises sputter depositing the Pd, Ru, Pt, Ti, or Au to have a columnar grain texture oriented normal to a plane of the substrate.

19. The method of claim 17, wherein the method comprises masking the second portion of the first material layer with a photodefinable material that is developed to expose the first portion of the first material layer within an opening of the photodefinable material.

* * * * *